United States Patent
Li et al.

(10) Patent No.: US 7,148,263 B2
(45) Date of Patent: Dec. 12, 2006

(54) HYBRID INORGANIC/ORGANIC LOW K DIELECTRIC FILMS WITH IMPROVED MECHANICAL STRENGTH

(75) Inventors: Bo Li, Campbell, CA (US); Victor Lu, Santa Cruz, CA (US); Paul G. Apen, San Jose, CA (US); Roger Y. Leung, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 288 days.

(21) Appl. No.: 10/890,981

(22) Filed: Jul. 14, 2004

(65) Prior Publication Data

US 2006/0014842 A1    Jan. 19, 2006

(51) Int. Cl.
*C08J 11/04* (2006.01)

(52) U.S. Cl. .......................... 521/50; 252/500; 257/40

(58) Field of Classification Search ................. 521/50, 521/61; 252/500; 257/40
See application file for complete search history.

(56) References Cited

U.S. PATENT DOCUMENTS

| | | | |
|---|---|---|---|
| 6,248,686 B1 | 6/2001 | Inagaki et al. | 502/158 |
| 2002/0065331 A1* | 5/2002 | Zampini et al. | 521/60 |
| 2004/0102006 A1* | 5/2004 | Xu et al. | 438/259 |

FOREIGN PATENT DOCUMENTS

JP    2002-134502    *    5/2002

* cited by examiner

*Primary Examiner*—Terressa Boykin
(74) *Attorney, Agent, or Firm*—Roberts & Roberts, LLP

(57) ABSTRACT

A method of producing a nanoporous silica dielectric film having improved mechanical strength. A composition is formed which comprises in admixture a porogen, a solvent, a catalyst and a combination of silicon containing prepolymers.

38 Claims, No Drawings

HYBRID INORGANIC/ORGANIC LOW K DIELECTRIC FILMS WITH IMPROVED MECHANICAL STRENGTH

BACKGROUND OF THE INVENTION

1. Field of the Invention

The present invention relates to the production of nanoporous silica dielectric films and to semiconductor devices and integrated circuits comprising these improved films. The invention relates to nanoporous films having improved mechanical strength, i.e., modulus and hardness. More particular, the invention relates to the preparation of a soluble polymer precursor solution for spin coating.

2. Description of the Related Art

As feature sizes in integrated circuits are reduced to below 0.15 µm and below, problems with interconnect RC delay, power consumption and signal cross-talk have become increasingly difficult to resolve. It is believed that the integration of low dielectric constant materials for interlevel dielectric (ILD) and intermetal dielectric (IMD) applications will help to solve these problems. While there have been previous efforts to apply low dielectric constant materials to integrated circuits, there remains a longstanding need in the art for further improvements in processing methods and in the optimization of both the dielectric and mechanical properties of such materials used in the manufacture of integrated circuits.

It is important for conventional dielectrics to possess a low dielectric constant as low as possible, toward a theoretical limit of 1.0. The practical expectation for polymer dielectrics as bulk materials is a dielectric constant range of 2.3–3.0, along with easy processibility by standard spin-bake-cure processing techniques. The dielectrics should also be free from moisture adsorption and out-gassing problems, in addition to their expected adhesive qualities and their dimensional stability towards thermal cycling, etching, and CMP processes. Organic dielectrics should have Tg values as high as possible toward 500° C., a value determined by the thermal stability of organic polymers. The high temperature conditions for multilayer construction and thermal cycling demand that the Tg be >400° C. The demand for a dielectric constant lower than 2.3 necessitates the development of dielectric materials with designed-in nanoporosity, either with nano-sized voids with controlled formation, or molecular free volume to reduce the bulk density and refractive index. Voids in polymer film structures may result in a lowering of mechanical strength. Therefore, a "closed" pore structure with small pore size distribution as well as uniform pore distribution throughout the matrix is preferred. Formation of such a "closed" pore structure with a lowering of dielectric constant and improved mechanical strength is very attractive to the process of integration. It precludes the difficulty of developing new process integration schemes, and avoids expensive purchases of new tools and/or modification of existing tools. Another very desirable feature is the etch/wet clean selectivity with inorganic anti-reflective coatings (ARC) materials. It facilitates the process integration of a hybrid low k film with an inorganic film such as ARC in the development of integrated circuits. Also a desirable feature in these thin films is the tenability of film thickness from 1,000 A to 25,000 A. The film thickness for spin-on dielectric is controlled by spin speed, matrix solution molecular weight, and solution viscosity. The solution viscosity is a function of matrix molecular weight, solvent and solution concentration at a given temperature.

The present invention relates to hybrid inorganic/organic chemical compositions for use in forming low k dielectric materials. In existing inorganic low k dielectric materials, a certain amount of an organic moiety is essential in producing hydrophobic films with the desired dielectric properties. However, this is done at the expense of weakening the mechanical strength, i.e. modulus and hardness, because pending organic groups in the network would reduce the mechanical strength of the silica network.

A layer of the composition is coated onto a substrate, crosslinked to produce a gel film, and then heated at a temperature and for a duration effective to remove substantially all of the porogen to thereby produce a nanoporous silica dielectric film.

In using a pre-polymer of the above Formula 1, a decrease in mechanical strength caused by free organic groups is eliminated or reduced, while a certain amount of organic moiety is maintained. An increase in organic content in the inorganic/organic hybrid materials would also provide the desired dielectric properties, which is an essential factor to the success of inorganic low k dielectric materials.

SUMMARY OF THE INVENTION

The invention provides a composition which comprises a homogeneous mixture of a porogen, a solvent, a catalyst, and a pre-polymer combination comprising a first silicon containing pre-polymer having Formula (I) and a second silicon containing prepolymer having Formula (II):

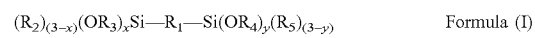

$(R_2)_{(3-x)}(OR_3)_x Si-R_1-Si(OR_4)_y(R_5)_{(3-y)}$  Formula (I)

$(R_6)_{(4-m)}Si(OR_7)_m$  (Formula II)

wherein x and y are each integers having a value of 0, 1, 2, or 3; m is an integer have a value of 1, 2, or 3;

$R_1$ is a polyvalent organic group selected from the group consisting of an alkyl group, an aryl group, a biphenyl group and an anthracenyl group;

$R_2$, $R_5$ and $R_6$, are independently a monovalent or polyvalent organic group selected from the group consisting of an alkyl group, an aryl group, hydrogen a biphenyl group and an anthracenyl group;

$R_3$, $R_4$ and $R_7$ are independently a monovalent or polyvalent organic group selected from the group consisting of an alkyl group, an aryl group, hydrogen, a biphenyl group, an anthracenyl group and an acyl group;

wherein the proportion of the first silicon containing pre-polymer to the total of the first silicon containing pre-polymer and the second silicon containing pre-polymer ranges from about 10 weight percent to about 90 weight percent, and which composition has a pH of less than 7.

The invention also provides a method of producing a nanoporous silica dielectric film comprising:

(a) preparing a composition which comprises a homogeneous mixture of a porogen, a solvent, a catalyst, and a pre-polymer combination comprising a first silicon containing pre-polymer having Formula (I) and a second silicon containing prepolymer having Formula (II):

$(R_2)_{(3-x)}(OR_3)_x Si-R_1-Si(OR_4)_y(R_5)_{(3-y)}$  Formula (I)

$(R_6)_{(4-m)}Si(OR_7)_m$  (Formula II)

wherein x and y are each integers having a value of 0, 1, 2, or 3; m is an integer have a value of 1, 2, or 3;

$R_1$ is a polyvalent organic group selected from the group consisting of an alkyl group, an aryl group, a biphenyl group and an anthracenyl group;

$R_2$, $R_5$ and $R_6$, are independently a monovalent or polyvalent organic group selected from the group consisting of an alkyl group, an aryl group, hydrogen a biphenyl group and an anthracenyl group;

$R_3$, $R_4$ and $R_7$ are independently a monovalent or polyvalent organic group selected from the group consisting of an alkyl group, an aryl group, hydrogen, a biphenyl group, an anthracenyl group and an acyl group;

wherein the proportion of the first silicon containing pre-polymer to the total of the first silicon containing pre-polymer and the second silicon containing pre-polymer ranges from about 10 weight percent to about 90 weight percent, and which composition has a pH of less than 7; and thereafter (b) coating a layer of the composition onto a substrate; thereafter (c) crosslinking the composition to produce a gelled film, and then (d) heating the gelled film at a temperature and for a duration effective to remove substantially all of said porogen to thereby produce a nanoporous silica dielectric film.

DETAILED DESCRIPTION OF THE PREFERRED EMBODIMENT

The invention relates to the preparation of a soluble polymer precursor solution for spin coating. The invention further relates to the formation of nanoporous silica dielectric films having low k, and an improved mechanical strength.

The nanoporous silica dielectric films of the invention are formed by preparing a composition which comprises a homogeneous mixture of a porogen, a solvent, a catalyst, and a pre-polymer combination comprising a first silicon containing pre-polymer having Formula (I) and a second silicon containing prepolymer having Formula (II).

Examples of suitable silicon containing pre-polymers according to Formula I include, but are not limited to: bis(triethoxysilyl)methane, bis(triethoxysilyl)ethane,

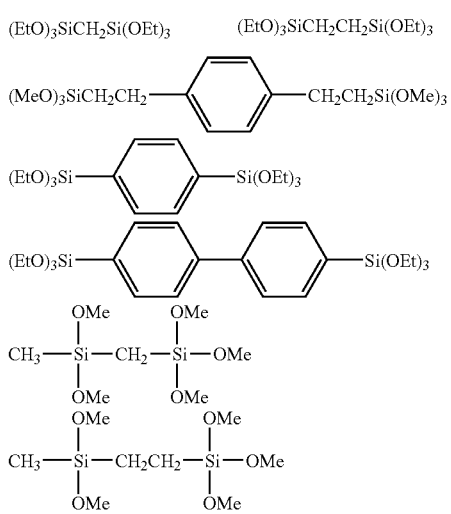

-continued

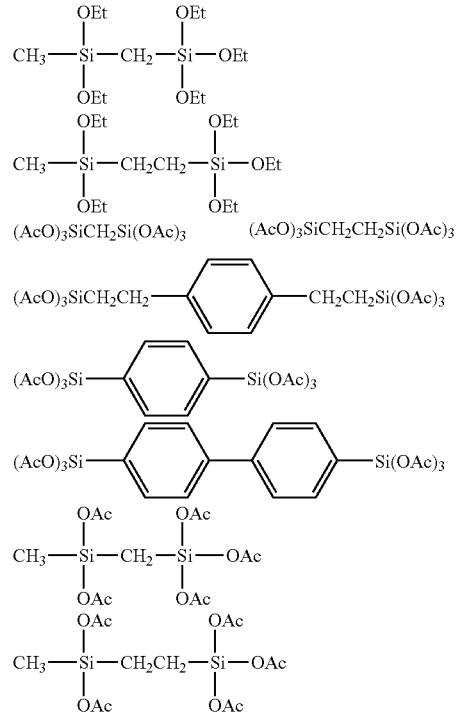

The preferred monomers are acetoxy compounds having the following general structure: $(R_2)_{(3-x)}(AcO)_xSi-R_1-Si(OAc)_y(R_3)_{(3-y)}$ wherein $R_1$ is any organic structure, for example, an aliphatic group such as $CH_2$, $CH_2CH_2$ etc; an aromatic structure $-C_6H_4-$, biphenyl, 9, 10-anthracenyl, etc.

$R_2$ and $R_3$ is an organic structure, for example, an aliphatic group $CH_3$, $CH_2CH_3$ etc, an aromatic structure $-C_6H_5$, biphenyl, 9-anthracenyl, etc. x and y are integers having a value of 0, 1, 2, or 3.

Examples of suitable silicon containing pre-polymers according to Formula II include, but are not limited to: methyltriethoxysilane, methyltriacetoxysilane, dimethyldiethoxysilane, dimethyldiacetoxysilane, trimethylethoxysilane, trimethylacetoxysilane.

The preferred monomers are acetoxy or ethoxy compounds having the following general structure: $(R_6)_{(4-m)}Si(OR_7)_m$ wherein $R_6$ and $R_7$ is any organic structure, for example, an aliphatic group $CH_3$, $CH_2CH_3$ etc, an aromatic structure $-C_6H_5$, biphenyl, 9-anthracenyl, a hydrogen, etc. m is an integer having a value of 1, 2, or 3.

In one embodiment, the proportion of the first silicon containing pre-polymer to the total of the first silicon containing pre-polymer and the second silicon containing pre-polymer ranges from about 10 weight percent to about 90 weight percent, In another embodiment, the proportion ranges from about 20 weight percent to about 85 weight percent. In yet another embodiment, the proportion ranges from about 30 weight percent to about 80 weight percent.

In one embodiment of the invention, the pre-polymer combination is present in the overall composition of the invention in an amount of from about 10 weight percent to about 80 weight percent, in another embodiment from about 20 weight percent to about 70 weight percent, and in another embodiment from about 25 weight percent to about 65 weight percent.

The pre-polymer combination may optionally be mixed with water. In one embodiment, the overall composition of the invention may comprise water, in either liquid or water vapor form. For example, the overall composition may be applied to a substrate and then exposed to an ambient atmosphere that includes water vapor at standard temperatures and standard atmospheric pressure. Optionally, the composition is prepared prior to application to a substrate to include water in a proportion suitable for initiating aging of the precursor composition, without being present in a proportion that results in the precursor composition aging or gelling before it can be applied to a desired substrate. By way of example, when water is mixed into the precursor composition it is present in a proportion wherein the composition comprises water in a molar ratio of water to Si atoms in the silicon containing prepolymer ranging from about 0.1:1 to about 50:1. In another embodiment, it ranges from about 0.1:1 to about 10:1 and in still another embodiment from about 0.5:1 to about 1.5:1.

The pre-polymer combination is combined with at least one porogen, and at least one solvent and at least one catalyst, to thereby form a composition. The term "pore" as used herein includes voids and cells in a material, and any other term meaning a space occupied by gas in the material. Appropriate gases include relatively pure gases and mixtures thereof. Air, which is predominantly a mixture of $N_2$ and $O_2$, is commonly distributed in the pores, but pure gases such as nitrogen, helium, argon, $CO_2$, or CO are also contemplated. Pores are typically spherical but may alternatively or additionally include tubular, lamellar, or discoidal voids, voids having other shapes, or a combination of the preceding shapes, and may be open or closed.

The term "porogen" as used herein means a decomposable material that is radiation, thermally, chemically, or moisture decomposable, degradable, depolymerizable, or otherwise capable of breaking down, and includes solid, liquid, or gaseous material. The decomposed porogen is removable from or can volatilize or diffuse through a partially or fully cross-linked matrix to create pores in a subsequently fully cured matrix and thus, lower the matrix's dielectric constant, and includes sacrificial polymers. Supercritical materials such as $CO_2$ may be used to remove the porogen and/or decomposed porogen fragments. For a thermally decomposable porogen, the porogen should comprise a material having a decomposition temperature less than the glass transition temperature (Tg) of a dielectric material combined with it and greater than the crosslinking temperature of the dielectric material combined with it. Thus, the dielectric material and porogen are different materials. Porogens may have a degradation or decomposition temperature of about 350° C. or lower.

The porogen may be a compound or oligomer or polymer and is selected such that, when it is removed, e.g., by the application of heat, a silica dielectric film is produced that has a nanometer scale porous structure. The scale of the pores produced by porogen removal is proportional to the effective steric diameters of the selected porogen component. The need for any particular pore size range (i.e., diameter) is defined by the scale of the semiconductor device in which the film is employed. Furthermore, the porogen should not be so small as to result in the collapse of the produced pores, e.g., by capillary action within such a small diameter structure, resulting in the formation of a non-porous (dense) film. Further still, there should be minimal variation in diameters of all pores in the pore population of a given film. The porogen may comprise a compound that has a substantially homogeneous molecular weight and molecular dimension, rather than a statistical distribution or range of molecular weights, and/or molecular dimensions, in a given sample. The avoidance of any significant variance in the molecular weight distribution allows for a substantially uniform distribution of pore diameters in the film treated by the inventive processes. If the produced film has a wide distribution of pore sizes, the likelihood is increased of forming one or more large pores that could interfere with the production of reliable semiconductor devices.

Furthermore, the porogen should have a molecular weight and structure such that it is readily and selectively removed from the film without interfering with film formation. This is based on the nature of semiconductor devices, which typically have an upper limit to processing temperatures. Broadly, a porogen should be removable from the newly formed film at temperatures below, e.g., about 450° C. In particular embodiments, depending on the desired post film formation fabrication process and materials, the porogen is selected to be readily removed at temperatures ranging from about 150° C. to about 450° C. during a time period ranging, e.g., from about 30 seconds to about 60 minutes. The removal of the porogen may be induced by heating the film at or above atmospheric pressure or under a vacuum, or by exposing the film to radiation, or both.

Porogens which meet the above characteristics include those compounds and polymers which have a boiling point, sublimation temperature, and/or decomposition temperature (at atmospheric pressure) range, for example, from about 150° C. to about 450° C. In addition, porogens suitable for use according to the invention include those having a molecular weight ranging, for example, from about 100 to about 50,000 amu, and in another embodiment the molecular weight ranges from about 100 to about 3,000 amu.

Porogens suitable for use in the processes and compositions of the invention include polymers, particularly those which contain one or more reactive groups, such as hydroxyl or amino. Within these general parameters, a suitable polymer porogen for use in the compositions and methods of the invention is, e.g., a polyalkylene oxide, a monoether of a polyalkylene oxide, a diether of a polyalkylene oxide, bisether of a polyalkylene oxide, an aliphatic polyester, an acrylic polymer, an acetal polymer, a poly(caprolactone), a poly(valeractone), a poly(methyl methacrylate), a poly (vinylbutyral) and/or combinations thereof. When the porogen is a polyalkylene oxide monoether, one particular embodiment is a $C_1$ to about $C_6$ alkyl chain between oxygen atoms and a $C_1$ to about $C_6$ alkyl ether moiety, and wherein the alkyl chain is substituted or unsubstituted, e.g., polyethylene glycol monomethyl ether, polyethylene glycol dimethyl ether, or polypropylene glycol monomethyl ether.

Other useful porogens are porogens that do not bond to the silicon containing pre-polymer, and include a poly (alkylene) diether, a poly(arylene) diether, poly(cyclic glycol) diether, Crown ethers, polycaprolactone, fully end-capped polyalkylene oxides, fully end-capped polyarylene oxides, polynorbene, and combinations thereof.

In one embodiment, the porogen does not bond to the silicon containing pre-polymer. Suitable porogens which do not bond to the silicon containing pre-polymer include poly(ethylene glycol) dimethyl ethers, poly(ethylene glycol) bis(carboxymethyl) ethers, poly(ethylene glycol) dibenzoates, poly(ethylene glycol) diglycidyl ethers, a poly(propylene glycol) dibenzoates, poly(propylene glycol) diglycidyl ethers, poly(propylene glycol) dimethyl ether, 15-Crown 5, 18-Crown-6, dibenzo-18-Crown-6, dicyclohexyl-18-Crown-6, dibenzo-15-Crown-5 and combinations thereof.

The porogen should be present in the overall composition in an amount ranging from about 1 to about 50 weight percent, or more. In one embodiment, the porogen is present in the composition in an amount ranging from about 2 to about 20 weight percent, and in another embodiment it is present in an amount of from about 3 weight percent to about 19 weight percent.

The solvent may be selected from the group consisting of hydrocarbons, esters, ethers, ketones, alcohols, amides and combinations thereof. In one preferred embodiment, the solvent is selected from the group consisting of di-n-butyl ether, anisole, acetone, 3-pentanone, 2-heptanone, ethyl acetate, n-propyl acetate, n-butyl acetate, 2-propanol, dimethyl acetamide, propylene glycol methyl ether acetate, and combinations thereof.

In one embodiment, the solvent has a boiling point ranging from about 50° C. to about 250° C. In order to meet various safety and environmental requirements, the solvent preferably has a high flash point (generally greater than 40° C.) and relatively low levels of toxicity.

The solvent should be present in the overall composition in an amount ranging from about 10 to about 95 weight percent. In one embodiment, the solvent is present in the composition in an amount ranging from about 20 to about 75 weight percent, and in another embodiment it is present in an amount of from about 20 weight percent to about 60 weight percent.

The composition then contains a catalyst. In one embodiment, the catalyst comprises a metal-ion-free catalyst such as an onium compound or a nucleophile. The catalyst may be, for example an ammonium compounds, an amine, a phosphonium compound or a phosphine compound. Nonexclusive examples of such include tetraorganoammonium compounds and tetraorganophosphonium compounds including tetramethylammonium acetate, tetramethylammonium hydroxide, tetrabutylammonium acetate, triphenylamine, trioctylamine, tridodecylamine, triethanolamine, tetramethylphosphonium acetate, tetramethylphosphonium hydroxide, triphenylphosphine, trimethylphosphine, trioctylphosphine, and combinations thereof. The composition may comprise a non-metallic, nucleophilic additive which accelerates the crosslinking of the composition. These include dimethyl sulfone, dimethyl formamide, hexamethylphosphorous triamide (HMPT), amines and combinations thereof. The catalyst is preferably present in the overall composition in an amount of from about 1 ppm by weight to about 1000 parts per million (ppm), preferably present in the overall composition in an amount of from about 6 ppm to about 200 ppm.

The composition may also comprise additional components such as adhesion promoters, antifoam agents, detergents, flame retardants, pigments, plasticizers, stabilizers, and surfactants. The present composition may also have utility in non-microelectronic applications such as thermal insulation, encapsulant, matrix materials for polymer and ceramic composites, light weight composites, acoustic insulation, anti-corrosive coatings, binders for ceramic powders, and fire retardant coatings.

The composition is in the form of a substantially homogeneous mixture which does not form a precipitate to any significant degree. The composition has a pH of less than 7. In one embodiment, the composition has a pH in the range of from about 0 to about 6, in another embodiment, the composition has a pH in the range of from about 1 to about 5.

Next, a layer of the composition is applied onto a substrate. The present films may be formed on various substrates. The term "substrate" as used herein includes any suitable material or composition formed before a nanoporous silica film of the invention is applied to and/or formed on that material or composition.

Suitable substrates nonexclusively include glass, ceramic, plastic, metal or coated metal, or composite material. For example, the substrate may comprise a semiconductor material such as silicon or gallium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and its oxides), and/or a polymer-based packaging or board interface such as found in a polyimide-based flex package, lead or other metal alloy solder ball surface, glass and polymers. Substrates may also include silicon, silicon nitride, silicon oxide, silicon oxycarbide, silicon dioxide, silicon carbide, silicon oxynitride, titanium nitride, tantalum nitride, tungsten nitride, aluminum, copper, tantalum, organosiloxanes, organo silicon glass, and fluorinated silicon glass.

On the surface of the substrate there may be an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. Useful metallic targets for making these lines are taught in commonly assigned U.S. Pat. Nos. 6,238,494 and 6,348,139 and are commercially available from Honeywell International Inc. These lines form the conductors or insulators of an integrated circuit. Such are typically closely separated from one another at distances of about 20 micrometers or less. In another embodiment, the lines are separated by 1 micrometer or less, and in yet another embodiment from about 0.05 to about 1 micrometer. Other optional features of the surface of a suitable substrate include an oxide layer, such as an oxide layer formed by heating a silicon wafer in air or, more particularly, an $SiO_2$ oxide layer formed by chemical vapor deposition of such art-recognized materials as, e.g., plasma enhanced tetraethoxysilane oxide ("PETEOS"), plasma enhanced silane oxide ("PE silane") and combinations thereof, as well as one or more previously formed nanoporous silica dielectric films.

The composition layer may be applied onto the substrate so as to cover and/or lie between such optional electronic surface features, e.g., circuit elements and/or conduction pathways that may have been previously formed features of the substrate. Such optional substrate features may also be applied above a nanoporous silica film of the invention in the form of at least one additional layer, so that the low dielectric film serves to insulate one or more electrically and/or electronically functional layers of the resulting integrated circuit. Thus, a substrate according to the invention optionally includes a silicon material that is formed over or adjacent to a nanoporous silica film of the invention, during the manufacture of a multilayer and/or multicomponent integrated circuit. In a further embodiment, a substrate bearing a nanoporous silica film or films according to the invention can be further covered with any art known nonporous insulation layer, such as a glass cap layer or the like.

The composition layer may be coated onto the substrate by any suitable solution technique, nonexclusively including spraying, rolling, dipping, brushing, spin coating, flow coating, or casting, and chemical vapor deposition, or the like, with spin coating being preferred for microelectronics. Prior to application of the composition layer, the substrate surface may optionally be prepared for coating by standard, art-known cleaning methods. For chemical vapor deposition (CVD), the composition is placed into an CVD apparatus, vaporized, and introduced into a deposition chamber containing the substrate to be coated. Vaporization may be accomplished by heating the composition above its vaporization point, by the use of a vacuum, or by a combination of the above. Generally, vaporization is accomplished at temperatures in the range of 50° C.–300° C. under atmospheric pressure or at lower temperature (near room temperature) under vacuum.

CVD processes as discussed here may include atmospheric pressure CVD (APCVD), low pressure CVD (LPCVD), and plasma enhanced CVD (PECVD). Each of these approaches had advantages and disadvantages. APCVD devices operate in a mass transport limited reaction mode at temperatures of approximately 400° C. In mass-transport limited deposition, temperature control of the deposition chamber is less critical than in other methods because mass transport processes are only weakly dependent on temperature. As the arrival rate of the reactants is directly proportional to their concentration in the bulk gas, maintaining a homogeneous concentration of reactants in the bulk gas adjacent to the wafers is critical. Thus, to insure films of uniform thickness across a wafer, reactors that are operated in the mass transport limited regime must be designed so that all wafer surfaces are supplied with an equal flux of reactant. The most widely used APCVD reactor designs provide a uniform supply of reactants by horizontally positioning the wafers and moving them under a gas stream.

In contrast to APCVD reactors, LPCVD reactors operate in a reaction rate-limited mode. In processes that are run under reaction rate-limited conditions, the temperature of the process is an important parameter. To maintain a uniform deposition rate throughout a reactor, the reactor temperature must be homogeneous throughout the reactor and at all wafer surfaces. Under reaction rate-limited conditions, the rate at which the deposited species arrive at the surface is not as critical as constant temperature. Thus, LPCVD reactors do not have to be designed to supply an invariant flux of reactants to all locations of a wafer surface.

Under the low pressure of an LPCVD reactor, for example, operating at medium vacuum (30–250 Pa or 0.25–2.0 torr) and higher temperature (550–600° C.), the diffusivity of the deposited species is increased by a factor of approximately 1000 over the diffusivity at atmospheric pressure. The increased diffusivity is partially offset by the fact that the distance across which the reactants must diffusive increases by less than the square root of the pressure. The net effect is that there is more than an order of magnitude increase in the transport of reactants to the substrate surface and by-products away from the substrate surface.

LPCVD reactors are designed in two primary configurations: (a) horizontal tube reactors; and (b) vertical flow isothermal reactors. Horizontal tube, hot wall reactors are the most widely used LPCVD reactors in VLSI processing. They are employed for depositing poly-Si, silicon nitride, and undoped and doped $SiO_2$ films. They find such broad applicability primarily because of their superior economy, throughput, uniformity, and ability to accommodate large diameter, e.g., 150 mm, wafers.

The vertical flow isothermal LPCVD reactor further extends the distributed gas feed technique so that each wafer receives an identical supply of fresh reactants. Wafers are again stacked side by side, but are placed in perforated-quartz cages. The cages are positioned beneath long, perforated, quartz reaction-gas injector tubes, one tube for each reactant gas. Gas flows vertically from the injector tubes, through the cage perforations, past the wafers, parallel to the wafer surface and into exhaust slots below the cage. The size, number, and location of cage perforations are used to control the flow of reactant gases to the wafer surfaces. By properly optimizing cage perforation design, each wafer may be supplied with identical quantities of fresh reactants from the vertically adjacent injector tubes. Thus, this design may avoid the wafer-to-wafer reactant depletion effects of the end-feed tube reactors, requires no temperature ramping, produces highly uniform depositions, and reportedly achieves low particulate contamination.

The third major CVD deposition method is PECVD. This method is categorized not only by pressure regime, but also by its method of energy input. Rather than relying solely on thermal energy to initiate and sustain chemical reactions, PECVD uses an rf-induced glow discharge to transfer energy into the reactant gases, allowing the substrate to remain at a lower temperature than in APCVD or LPCVD processes. Lower substrate temperature is the major advantages of PECVD, providing film deposition on substrates not having sufficient thermal stability to accept coating by other methods. PECVD may also enhance deposition rates over those achieved using thermal reactions. Moreover, PECVD may produce films having unique compositions and properties. Desirable properties such as good adhesion, low pinpole density, good step coverage, adequate electrical properties, and compatibility with fine-line pattern transfer processes, have led to application of these films in VLSI.

PECVD requires control and optimization of several deposition parameters, including rf power density, frequency, and duty cycle. The deposition process is dependent in a complex and interdependent way on these parameters, as well as on the usual parameters of gas composition, flow rates, temperature, and pressure. Furthermore, as with LPCVD, the PECVD method is surface reaction limited, and adequate substrate temperature control is thus necessary to ensure uniform film thickness.

CVD systems usually contain the following components: gas sources, gas feed lines, mass-flow controllers for metering the gases into the system, a reaction chamber or reactor, a method for heating the wafers onto which the film is to be deposited, and in some types of systems, for adding additional energy by other means, and temperature sensors. LPCVD and PECVD systems also contain pumps for establishing the reduced pressure and exhausting the gases from the chamber.

Next, the composition layer is crosslinked to produce a gelled film. Those skilled in the art will appreciate that specific temperature ranges for crosslinking and porogen removal from the nanoporous dielectric films will depend on the selected materials, substrate and desired nanoscale pore structure, as is readily determined by routine manipulation of these parameters. Generally, the coated substrate is subjected to a treatment such as heating to effect crosslinking of the composition on the substrate to produce a gelled film.

Crosslinking may be done by heating the film at a temperature ranging from about 100° C. to about 250° C., for a time period ranging from about 30 seconds to about 10 minutes to gel the film. Additional curing methods include the application of sufficient energy to cure the film by exposure of the film to electron beam energy, ultraviolet energy, microwave energy, and the like, according to art-known methods.

Next, the gelled film is heated at a temperature and for a duration effective to remove substantially all of said porogen to thereby produce a nanoporous silica dielectric film. The porogen should be sufficiently non-volatile so that it does not evaporate from the film before the film solidifies. The gelled film should be heated at a temperature ranging from about 150° C. to about 450° C. In another embodiment, it is heated from about 150° C. to about 350° C. for a time period ranging from about 30 seconds to about 1 hour. An important feature of the invention is that the step (c) crosslinking should be conducted at a temperature which is less than the heating temperature of step (d).

The nanoporous silica dielectric film formed according to the invention should have an average pore diameter in the range of from about 1 nm to about 30 nm. In one embodiment of the invention, the pore diameter ranges from about 1 nm to about 10 nm and in another embodiment it ranges from about 1 nm to about 6 nm.

The method of the present invention may be used to produce various nanoporous dielectric film containing devices, semiconductor devices, and the like. In particular, the nanoporous silica dielectric films formed according to the invention may be used in microelectronic applications, such as for dielectric substrate materials in microchips, multichip modules, laminated circuit boards, or printed wiring boards. They may also be used in electrical devices and more specifically, as an interlayer dielectric in an interconnect associated with a single integrated circuit ("IC") chip. An integrated circuit chip typically has on its surface a plurality of layers of the present composition and multiple layers of metal conductors. It may also include regions of the present composition between discrete metal conductors or regions of conductor in the same layer or level of an integrated circuit. The present nanoporous silica dielectric films may also be used as an etch stop or hardmask layer. The films of the present invention may further be used in dual damascene (such as copper) processing and substractive metal (such as aluminum or aluminum/tungsten) processing for integrated circuit manufacturing. The present composition may be used in a desirable all spin-on stacked film as taught by Michael E. Thomas, "Spin-On Stacked Films for Low keff Dielectrics", Solid State Technology (July 2001), incorporated herein in its entirety by reference. The present composition may be used in an all spin-on stacked film having additional dielectrics such as taught by U.S. Pat. Nos. 6,248,457; 5,986,045; 6,124,411; and 6,303,733.

Analytical Test Methods:

Dielectric Constant: The dielectric constant was determined by coating a thin film of aluminum on the cured layer and then doing a capacitance-voltage measurement at 1 MHz and calculating the k value based on the layer thickness.

Refractive Index: The refractive index measurements were performed together with the thickness measurements using a J. A. Woollam M-88 spectroscopic ellipsometer. A Cauchy model was used to calculate the best fit for Psi and Delta. Unless noted otherwise, the refractive index was reported at a wavelength of 633 nm (details on Ellipsometry can be found in e.g. "Spectroscopic Ellipsometry and Reflectometry" by H. G. Thompkins and William A. McGahan, John Wiley and Sons, Inc., 1999).

The following non-limiting examples serve to illustrate the invention. It will be appreciated that variations in proportions and alternatives in elements of the components of the invention will be apparent to those skilled in the art and are within the scope of the present invention.

EXAMPLE 1

To a 100-mL flask equipped with a magnetic stirrer and a nitrogen inlet-outlet were added 14.88 g of 1,2-bis(triethoxysilyl)ethane (BTESE), 7.483 g of methyltriethoxysilane and 36.00 g of propylene glycol methyl ether acetate (PGMEA). The mixture was stirred at room temperature for half hour. To this mixture were added 9.26 g of deionized water and 0.39 g of acetic acid. The mixture was heated at 80 C for 1 hour with stirring. The reaction mixture was then allowed to cool to room temperature and kept stirring overnight. To this solution was added 0.067 g of 1% tetramethylammonium acetate (TMAA) aqueous solution. The mixture was stirred at room temperature for a half hour. The clear solution that obtained was filtered through 0.2 μm teflon filter twice and was ready for spin coating. See Sample 1, Table 1. In the table, capacitance of the film was measured under ambient conditions (room temperature and humidity). Dielectric constant based on ambient capacitance value is called k ambient. The capacitance of the film was measured again after heating the wafer in a hot plate at 200 C for 2 minutes in order to drive off adsorbed moisture. Dielectric constant based on the de-moisture capacitance is called k de-gas.

TABLE 1

| Properties | Film Properties | | | |
|---|---|---|---|---|
| | Sample 1 | ACCU-GLASS ® SPIN-ON GLASS 512B | NANOGLASS ® E | MSQ |
| Film Thickness (μm) | 1.1731 | 0.9368 | 0.7511 | 0.6245 |
| Refractive Index | 1.43 | 1.39 | 1.40 | 1.38 |
| Dielectric Const. ($k_{ambient}$) | 3.23 | 3.40 | 3.58 | 2.81 |
| Dielectric Const. ($k_{de-gas}$) | 3.13 | 3.08 | 3.38 | 2.79 |
| Modulus (GPa) | 14.411 | 4.10 | 11.51 | 5.30 |
| Hardness (GPa) | 1.688 | 0.39 | 1.14 | 0.84 |
| SiC/SiO Ratio | 0.030 | 0.032 | 0.034 | 0.059 |
| C % wt (Theoretical) | 0.18 | 0.11 | 0.10 | 0.18 |
| Modulus/$k_{degas}$ | 4.60 | 1.33 | 3.41 | 1.90 |

The ratio of modulus over k de-gas is, in general, a good indication of the mechanical strength of a given material. The film sample 1 exhibits a very high modulus over kde-gas value (4.60) than all the other samples (ranging from 1.3 to 3.4) (Table 1).

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A composition which comprises a homogeneous mixture of a porogen, a solvent, a catalyst, and a pre-polymer combination comprising a first silicon containing pre-polymer having Formula (I) and a second silicon containing prepolymer having Formula (II):

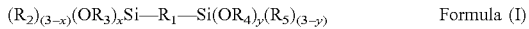 Formula (I)

 (Formula II)

wherein x and y are each integers having a value of 0, 1, 2, or 3; m is an integer have a value of 1, 2, or 3;

- $R_1$ is a polyvalent organic group selected from the group consisting of an alkyl group, an aryl group, a biphenyl group and an anthracenyl group;
- $R_2$, $R_5$ and $R_6$, are independently a monovalent or polyvalent organic group selected from the group consisting of an alkyl group, an aryl group, hydrogen a biphenyl group and an anthracenyl group;
- $R_3$, $R_4$ and $R_7$ are independently a monovalent or polyvalent organic group selected from the group consisting of an alkyl group, an aryl group, hydrogen, a biphenyl group, an anthracenyl group and an acyl group;

wherein the proportion of the first silicon containing pre-polymer to the total of the first silicon containing pre-polymer and the second silicon containing pre-polymer ranges from about 10 weight percent to about 90 weight percent, and which composition has a pH of less than 7.

2. The composition of claim 1 wherein $R_1$ comprises a polyvalent organic group selected from the group consisting of —$CH_2$—, —$CH_2CH_2$—, —$C_6H_4$—, -biphenyl-, and 9,10-anthracenyl.

3. The composition of claim 1 wherein $R_2$, $R_3$, $R_4$, $R_5$ $R_6$, and $R_7$ are each independently a monovalent organic group selected from the group consisting of —$CH_3$, —$CH_2CH_3$, —$C_6H_5$, —H, -biphenyl, and 9-anthracenyl.

4. The composition of claim 1 wherein the pre-polymer combination comprises an acetoxysilane, an ethoxysilane, a methoxysilane, or combinations thereof.

5. The composition of claim 1 wherein the wherein the pre-polymer combination comprises methyltriethoxysilane.

6. The composition of claim 1 wherein the porogen is present in the composition in an amount of from about 1 to about 50 weight percent.

7. The composition of claim 1 wherein the porogen is selected from the group consisting of a poly(ethylene glycol) dimethyl ether, a poly(ethylene glycol) bis(carboxymethyl) ether, a poly(ethylene glycol) dibenzoate, a poly(ethylene glycol) propylmethyl ether, a poly(ethylene glycol) diglycidyl ether, a poly(propylene glycol) dibenzoate, a poly(propylene glycol) dibutyl ether, a poly(propylene glycol) dimethyl ether, a poly(propylene glycol) diglycidyl ether, 15-Crown 5, 18-Crown-6, dibenzo-18-Crown-6, dicyclohexyl-18-Crown-6, dibenzo-15-Crown-5 and combinations thereof.

8. The composition of claim 1 wherein the porogen comprises a polyalkylene oxide monoether which comprises a $C_1$ to about $C_6$ alkyl chain between oxygen atoms and a $C_1$ to about $C_6$ alkyl ether moiety, and wherein the alkyl chain is substituted or unsubstituted.

9. The composition of claim 1 wherein the solvent is present in the composition in an amount of from about 10 to about 95 percent by weight of the composition.

10. The composition of claim 1 wherein the solvent has a boiling point ranging from about 50° C. to about 250° C.

11. The composition of claim 1 wherein the solvent is selected from the group consisting of hydrocarbons, esters, ethers, ketones, alcohols, amides and combinations thereof.

12. The composition of claim 1 wherein the solvent is selected from the group consisting of di-n-butyl ether, anisole, acetone, 3-pentanone, 2-heptanone, ethyl acetate, n-propyl acetate, n-butyl acetate, 2-propanol, dimethyl acetamide, propylene glycol methyl ether acetate, and combinations thereof.

13. The composition of claim 1 which further comprises a nucleophilic additive selected from the group consisting of dimethyl sulfone, dimethyl formamide, hexamethylphosphorous triamide, amines and combinations thereof.

14. The composition of claim 1 wherein the catalyst comprises a metal-ion-free catalyst selected from the group consisting of onium compounds and nucleophiles.

15. The composition of claim 1 further comprising a nucleophilic additive which accelerates the crosslinking of the composition, which is selected from the group consisting of dimethyl sulfone, dimethyl formamide, hexamethylphosphorous triamide, amines and combinations thereof.

16. The composition of claim 1 wherein the catalyst is selected from the group consisting of ammonium compounds, amines, phosphonium compounds, and phosphine compounds.

17. The composition of claim 1 wherein the catalyst is selected from the group consisting of tetraorganoammonium compounds and tetraorganophosphonium compounds.

18. The composition of claim 1 wherein the catalyst is selected from the group consisting of tetramethylammonium acetate, tetramethylammonium hydroxide, tetrabutylammonium acetate, triphenylamine, trioctylamine, tridodecylamine, triethanolamine, tetramethylphosphonium acetate, tetramethylphosphonium hydroxide, triphenylphosphine, trimethylphosphine, trioctylphosphine, and combinations thereof.

19. A method of producing a nanoporous silica dielectric film comprising:

(a) preparing a composition which comprises a homogeneous mixture of a porogen, a solvent, a catalyst, and a pre-polymer combination comprising a first silicon containing pre-polymer having Formula (I) and a second silicon containing prepolymer having Formula (II):

 Formula (I)

 (Formula II)

wherein x and y are each integers having a value of 0, 1, 2, or 3; m is an integer have a value of 1, 2, or 3;

- $R_1$ is a polyvalent organic group selected from the group consisting of an alkyl group, an aryl group, a biphenyl group and an anthracenyl group;
- $R_2$, $R_5$ and $R_6$, are independently a monovalent or polyvalent organic group selected from the group consisting of an alkyl group, an aryl group, hydrogen a biphenyl group and an anthracenyl group;
- $R_3$, $R_4$ and $R_7$ are independently a monovalent or polyvalent organic group selected from the group consisting of an alkyl group, an aryl group, hydrogen, a biphenyl group, an anthracenyl group and an acyl group;

wherein the proportion of the first silicon containing pre-polymer to the total of the first silicon containing pre-polymer and the second silicon containing pre-polymer ranges from about 10 weight percent to about 90 weight percent, and which composition has a pH of less than 7; and thereafter (b) coating a layer of the composition onto a substrate; thereafter (c) crosslinking the composition to produce a gelled film, and then (d) heating the gelled film at a temperature and for a duration effective to remove substantially all of said porogen to thereby produce a nanoporous silica dielectric film.

20. The method of claim 19 wherein $R_1$ comprises a polyvalent organic group selected from the group consisting of —$CH_2$—, —$CH_2CH_2$—, —$C_6H_4$—, -biphenyl-, and 9,10-anthracenyl.

21. The method of claim 19 wherein $R_2$, $R_3$, $R_4$, $R_5$, $R_6$ and $R_7$, are each independently a monovalent or polyvalent organic group selected from the group consisting of —$CH_3$, —$CH_2CH_3$, —$C_6H_5$, —H, -biphenyl, and 9-anthracenyl.

22. The method of claim 19 wherein the nanoporous silica dielectric film has a glass transition temperature of 400° C. or greater.

23. The method of claim 19 wherein the pre-polymer combination comprises an acetoxysilane, an ethoxysilane, a methoxysilane, or combinations thereof.

24. The method of claim 19 wherein the pre-polymer combination comprises methyltriethoxysilane.

25. The method of claim 19 wherein the porogen is present in the composition in an amount of from about 1 to about 50 weight percent.

26. The method of claim 19 wherein the porogen is selected from the group consisting of a poly(ethylene glycol) dimethyl ether, a poly(ethylene glycol) bis(carboxymethyl) ether, a poly(ethylene glycol) dibenzoate, a poly(ethylene glycol) propylmethyl ether, a poly(ethylene glycol) diglycidyl ether, a poly(propylene glycol) dibenzoate, a poly(propylene glycol) dibutyl ether, a poly(propylene glycol) dimethyl ether, a poly(propylene glycol) diglycidyl ether, 15-Crown 5, 18-Crown-6, dibenzo-18-Crown-6, dicyclohexyl-18-Crown-6, dibenzo-15-Crown-5 and combinations thereof.

27. The method of claim 19 wherein the porogen comprises a polyalkylene oxide monoether which comprises a $C_1$ to about $C_6$ alkyl chain between oxygen atoms and a $C_1$ to about $C_6$ alkyl ether moiety, and wherein the alkyl chain is substituted or unsubstituted.

28. The method of claim 19 wherein the solvent is selected from the group consisting of hydrocarbons, esters, ethers, ketones, alcohols, amides and combinations thereof.

29. The method of claim 19 wherein the solvent is selected from the group consisting of di-n-butyl ether, anisole, acetone, 3-pentanone, 2-heptanone, ethyl acetate, n-propyl acetate, n-butyl acetate, 2-propanol, dimethyl acetamide, propylene glycol methyl ether acetate, and combinations thereof.

30. The method of claim 19 wherein the composition comprises a nucleophilic additive which accelerates the crosslinking of the composition, which is selected from the group consisting of dimethyl sulfone, dimethyl formamide, hexamethylphosphorous triamide, amines and combinations thereof.

31. The method of claim 19 wherein the step (c) crosslinking is conducted at a temperature which is less than the heating temperature of step (d).

32. The method of claim 19 wherein heating step (d) comprises heating the film at a temperature ranging from about 100° C. to about 250° C., for a time period ranging from about 30 seconds to about 10 minutes.

33. The method of claim 19 wherein step (d) comprises heating the film at a temperature ranging from about 150° C. to about 450° C., for a time period ranging from about 30 seconds to about 1 hour.

34. The method of claim 19 wherein the substrate comprises silicon, gallium arsenide, silicon nitride, silicon oxide, silicon oxycarbide, silicon dioxide, silicon carbide, silicon oxynitride, titanium nitride, tantalum nitride, tungsten nitride, aluminum, copper, tantalum, organosiloxanes, organo silicon glass, fluorinated silicon glass or combinations thereof.

35. The method of claim 19 wherein the substrate comprises metallic lines on its surface.

36. A nanoporous dielectric film produced by the method of claim 19.

37. A semiconductor device comprising a nanoporous dielectric produced by the method of claim 19.

38. The semiconductor device of claim 37 that is an integrated circuit.

* * * * *